United States Patent
Kuo et al.

(10) Patent No.: US 11,315,896 B2
(45) Date of Patent: *Apr. 26, 2022

(54) CONICAL-SHAPED OR TIER-SHAPED PILLAR CONNECTIONS

(71) Applicant: Taiwan Semiconductor Manufacturing Company, Ltd., Hsinchu (TW)

(72) Inventors: Tin-Hao Kuo, Hsinchu (TW);
Chen-Shien Chen, Zhubei (TW);
Mirng-Ji Lii, Sinpu Township (TW);
Chen-Hua Yu, Hsinchu (TW);
Sheng-Yu Wu, Hsinchu (TW);
Yao-Chun Chuang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 34 days.

This patent is subject to a terminal disclaimer.

(21) Appl. No.: 16/105,014

(22) Filed: Aug. 20, 2018

(65) Prior Publication Data

US 2018/0358316 A1    Dec. 13, 2018

Related U.S. Application Data

(63) Continuation of application No. 15/243,523, filed on Aug. 22, 2016, now Pat. No. 10,056,345, which is a (Continued)

(51) Int. Cl.
*H01L 23/00* (2006.01)
*H01L 23/498* (2006.01)

(52) U.S. Cl.
CPC ........ *H01L 24/13* (2013.01); *H01L 23/49816* (2013.01); *H01L 24/11* (2013.01);
(Continued)

(58) Field of Classification Search
CPC ........ H01L 24/11; H01L 24/13; H01L 24/16; H01L 23/49816; H01L 2224/0361;
(Continued)

(56) References Cited

U.S. PATENT DOCUMENTS

| 4,258,382 A | 3/1981 | Harris |
| 4,536,421 A | 8/1985 | Matsuzawa et al. |

(Continued)

FOREIGN PATENT DOCUMENTS

| CN | 101080138 A | 11/2007 |
| CN | 101188219 A | 5/2008 |

(Continued)

OTHER PUBLICATIONS

Garrou, Phil, "IFTLE 58 Fine Pitch Microjoints, Cu Pillar Bump-on-Lead, Xillinx Interposer Reliability," Solid State Technology, Insights for Electronic Manufacturing, Jul. 18, 2011, 3 pages.

*Primary Examiner* — Sue A Purvis
*Assistant Examiner* — Scott Stowe
(74) *Attorney, Agent, or Firm* — Slater Matsil, LLP

(57) ABSTRACT

A pillar structure, and a method of forming, for a substrate is provided. The pillar structure may have one or more tiers, where each tier may have a conical shape or a spherical shape. In an embodiment, the pillar structure is used in a bump-on-trace (BOT) configuration. The pillar structures may have circular shape or an elongated shape in a plan view. The substrate may be coupled to another substrate. In an embodiment, the another substrate may have raised conductive traces onto which the pillar structure may be coupled.

20 Claims, 6 Drawing Sheets

Related U.S. Application Data continuation of application No. 13/449,078, filed on Apr. 17, 2012, now Pat. No. 9,425,136.

(52) U.S. Cl.
CPC ...... *H01L 24/16* (2013.01); *H01L 2224/0361* (2013.01); *H01L 2224/03912* (2013.01); *H01L 2224/11462* (2013.01); *H01L 2224/11464* (2013.01); *H01L 2224/11472* (2013.01); *H01L 2224/11474* (2013.01); *H01L 2224/11903* (2013.01); *H01L 2224/1308* (2013.01); *H01L 2224/13012* (2013.01); *H01L 2224/13014* (2013.01); *H01L 2224/13017* (2013.01); *H01L 2224/13025* (2013.01); *H01L 2224/13083* (2013.01); *H01L 2224/13111* (2013.01); *H01L 2224/13147* (2013.01); *H01L 2224/13155* (2013.01); *H01L 2224/13184* (2013.01); *H01L 2224/16238* (2013.01); *H01L 2224/81191* (2013.01); *H01L 2924/0105* (2013.01); *H01L 2924/01029* (2013.01); *H01L 2924/01047* (2013.01); *H01L 2924/01079* (2013.01); *H01L 2924/01082* (2013.01); *H01L 2924/01327* (2013.01); *H01L 2924/15787* (2013.01); *H01L 2924/15788* (2013.01); *H01L 2924/181* (2013.01); *H01L 2924/3512* (2013.01); *H01L 2924/35121* (2013.01)

(58) Field of Classification Search
CPC . H01L 2224/03912; H01L 2224/11462; H01L 2224/11464; H01L 2224/11472; H01L 2224/11474; H01L 2224/11903; H01L 2224/13012; H01L 2224/13014; H01L 2224/13017; H01L 2224/13025; H01L 2224/1308; H01L 2224/13083; H01L 2224/13111; H01L 2224/13147; H01L 2224/13155; H01L 2224/13184; H01L 2224/16238; H01L 2224/81191; H01L 2924/01029; H01L 2924/01047; H01L 2924/0105; H01L 2924/01079; H01L 2924/01082; H01L 2924/01327; H01L 2924/15787; H01L 2924/15788; H01L 2924/181; H01L 2924/3512; H01L 2924/35121

See application file for complete search history.

(56) References Cited

U.S. PATENT DOCUMENTS

| | | |
|---|---|---|
| 4,811,082 A | 3/1989 | Jacobs et al. |
| 4,830,723 A | 5/1989 | Galvagni et al. |
| 4,990,462 A | 2/1991 | Sliwa, Jr. |
| 5,075,253 A | 12/1991 | Sliwa, Jr. |
| 5,075,965 A | 12/1991 | Carey et al. |
| 5,130,779 A | 7/1992 | Agarwala et al. |
| 5,134,460 A | 7/1992 | Brady et al. |
| 5,277,756 A | 1/1994 | Dion |
| 5,334,804 A | 8/1994 | Love et al. |
| 5,380,681 A | 1/1995 | Hsu |
| 5,431,328 A | 7/1995 | Chang et al. |
| 5,440,239 A | 8/1995 | Zappella et al. |
| 5,470,787 A | 11/1995 | Greer |
| 5,481,133 A | 1/1996 | Hsu |
| 5,492,266 A | 2/1996 | Hoebener et al. |
| 5,508,561 A | 4/1996 | Tago et al. |
| 5,542,601 A | 8/1996 | Fallon et al. |
| 5,565,379 A | 10/1996 | Baba |
| 5,587,337 A | 12/1996 | Idaka et al. |
| 5,680,187 A | 10/1997 | Nagayama et al. |
| 5,743,006 A | 4/1998 | Beratan |
| 5,790,377 A | 8/1998 | Schreiber et al. |
| 5,796,591 A | 8/1998 | Dalal et al. |
| 5,816,478 A | 10/1998 | Kaskoun et al. |
| 5,889,326 A | 3/1999 | Tanaka |
| 5,922,496 A | 7/1999 | Dalal et al. |
| 5,977,599 A | 11/1999 | Adrian |
| 6,002,172 A | 12/1999 | Desai et al. |
| 6,002,177 A | 12/1999 | Gaynes et al. |
| 6,025,650 A | 2/2000 | Tsuji et al. |
| 6,051,273 A | 4/2000 | Dalal et al. |
| 6,082,610 A | 7/2000 | Shangguan et al. |
| 6,091,141 A | 7/2000 | Heo |
| 6,099,935 A | 8/2000 | Brearley et al. |
| 6,130,476 A | 10/2000 | LaFontaine, Jr. et al. |
| 6,137,184 A | 10/2000 | Ikegami |
| 6,181,010 B1 | 1/2001 | Nozawa |
| 6,187,678 B1 | 2/2001 | Gaynes et al. |
| 6,229,216 B1 | 5/2001 | Ma et al. |
| 6,229,220 B1 | 5/2001 | Saitoh et al. |
| 6,236,115 B1 | 5/2001 | Gaynes et al. |
| 6,249,051 B1 | 6/2001 | Chang et al. |
| 6,250,541 B1 | 6/2001 | Shangguan et al. |
| 6,259,159 B1 | 7/2001 | Dalal et al. |
| 6,271,059 B1 | 8/2001 | Bertin et al. |
| 6,279,815 B1 | 8/2001 | Correia et al. |
| 6,291,891 B1 | 9/2001 | Higashi et al. |
| 6,336,262 B1 | 1/2002 | Dalal et al. |
| 6,344,234 B1 | 2/2002 | Dalal et al. |
| 6,346,469 B1 | 2/2002 | Greer |
| 6,355,501 B1 | 3/2002 | Fung et al. |
| 6,358,847 B1 | 3/2002 | Li et al. |
| 6,388,322 B1 | 5/2002 | Goossen et al. |
| 6,424,037 B1 | 7/2002 | Ho et al. |
| 6,426,556 B1 | 7/2002 | Lin |
| 6,434,016 B2 | 8/2002 | Zeng et al. |
| 6,448,661 B1 | 9/2002 | Kim et al. |
| 6,461,895 B1 | 10/2002 | Liang et al. |
| 6,469,394 B1 | 10/2002 | Wong et al. |
| 6,475,897 B1 | 11/2002 | Hosaka |
| 6,476,503 B1 | 11/2002 | Imamura et al. |
| 6,492,197 B1 | 12/2002 | Rinne |
| 6,498,308 B2 | 12/2002 | Sakamoto |
| 6,562,653 B1 | 5/2003 | Ma et al. |
| 6,562,657 B1 | 5/2003 | Lin |
| 6,570,248 B1 | 5/2003 | Ahn et al. |
| 6,573,598 B2 | 6/2003 | Ohuchi et al. |
| 6,578,754 B1 | 6/2003 | Tung |
| 6,583,846 B1 | 6/2003 | Yanagawa et al. |
| 6,592,019 B2 | 7/2003 | Tung |
| 6,592,657 B2 | 7/2003 | Lee et al. |
| 6,600,222 B1 | 7/2003 | Levardo |
| 6,607,938 B2 | 8/2003 | Kwon et al. |
| 6,661,085 B2 | 12/2003 | Kellar et al. |
| 6,713,844 B2 | 3/2004 | Tatsuta et al. |
| 6,731,003 B2 | 5/2004 | Joshi et al. |
| 6,762,076 B2 | 7/2004 | Kim et al. |
| 6,790,748 B2 | 9/2004 | Kim et al. |
| 6,887,769 B2 | 5/2005 | Kellar et al. |
| 6,908,565 B2 | 6/2005 | Kim et al. |
| 6,908,785 B2 | 6/2005 | Kim |
| 6,924,551 B2 | 8/2005 | Rumer et al. |
| 6,940,169 B2 | 9/2005 | Jin et al. |
| 6,940,178 B2 | 9/2005 | Kweon et al. |
| 6,943,067 B2 | 9/2005 | Greenlaw |
| 6,946,384 B2 | 9/2005 | Kloster et al. |
| 6,972,490 B2 | 12/2005 | Chang et al. |
| 6,975,016 B2 | 12/2005 | Kellar et al. |
| 6,998,216 B2 | 2/2006 | He et al. |
| 7,037,804 B2 | 5/2006 | Kellar et al. |
| 7,056,807 B2 | 6/2006 | Kellar et al. |
| 7,087,538 B2 | 8/2006 | Staines et al. |
| 7,135,766 B1 | 11/2006 | Costa et al. |
| 7,151,009 B2 | 12/2006 | Kim et al. |
| 7,157,787 B2 | 1/2007 | Kim et al. |
| 7,192,803 B1 | 3/2007 | Lin et al. |
| 7,215,033 B2 | 5/2007 | Lee et al. |
| 7,245,023 B1 | 7/2007 | Lin |
| 7,251,484 B2 | 7/2007 | Aslanian |
| 7,271,483 B2 | 9/2007 | Lin et al. |

(56) References Cited

U.S. PATENT DOCUMENTS

| | | |
|---|---|---|
| 7,271,484 B2 | 9/2007 | Reiss et al. |
| 7,276,799 B2 | 10/2007 | Lee et al. |
| 7,279,795 B2 | 10/2007 | Periaman et al. |
| 7,307,005 B2 | 12/2007 | Kobrinsky et al. |
| 7,317,256 B2 | 1/2008 | William et al. |
| 7,320,928 B2 | 1/2008 | Kloster et al. |
| 7,345,350 B2 | 3/2008 | Sinha |
| 7,382,049 B2 | 6/2008 | Ho et al. |
| 7,402,442 B2 | 7/2008 | Condorelli et al. |
| 7,402,508 B2 | 7/2008 | Kaneko |
| 7,402,515 B2 | 7/2008 | Arana et al. |
| 7,410,884 B2 | 8/2008 | Ramanathan et al. |
| 7,432,592 B2 | 10/2008 | Shi et al. |
| 7,459,785 B2 | 12/2008 | Daubenspeck et al. |
| 7,470,996 B2 | 12/2008 | Yoneyama et al. |
| 7,494,845 B2 | 2/2009 | Hwang et al. |
| 7,495,179 B2 | 2/2009 | Kubota et al. |
| 7,528,494 B2 | 5/2009 | Furukawa et al. |
| 7,531,890 B2 | 5/2009 | Kim |
| 7,554,201 B2 | 6/2009 | Kang et al. |
| 7,557,597 B2 | 7/2009 | Anderson et al. |
| 7,569,935 B1 | 8/2009 | Fan |
| 7,576,435 B2 | 8/2009 | Chao |
| 7,659,631 B2 | 2/2010 | Kamins et al. |
| 7,714,235 B1 | 5/2010 | Pedersen et al. |
| 7,804,177 B2 | 9/2010 | Lu |
| 7,834,450 B2 | 11/2010 | Kang |
| 7,939,939 B1 | 5/2011 | Zeng et al. |
| 7,946,331 B2 | 5/2011 | Trezza et al. |
| 8,026,128 B2 | 9/2011 | Pendse |
| 8,076,232 B2 | 12/2011 | Pendse |
| 8,093,729 B2 | 1/2012 | Trezza |
| 8,120,175 B2 | 2/2012 | Farooq et al. |
| 8,130,475 B2 | 3/2012 | Kawamori et al. |
| 8,158,489 B2 | 4/2012 | Huang et al. |
| 8,207,604 B2 | 6/2012 | Haba et al. |
| 8,232,640 B2 | 7/2012 | Tomoda et al. |
| 8,258,055 B2 | 9/2012 | Hwang et al. |
| 8,313,213 B2 | 11/2012 | Lin et al. |
| 8,367,939 B2 | 2/2013 | Ishido |
| 8,435,881 B2 | 5/2013 | Choi et al. |
| 8,536,458 B1 | 9/2013 | Darveaux et al. |
| 8,576,368 B2 | 11/2013 | Kim et al. |
| 8,823,166 B2 | 9/2014 | Lin et al. |
| 9,105,530 B2 | 8/2015 | Lin et al. |
| 9,355,980 B2 | 5/2016 | Chen et al. |
| 9,425,136 B2 * | 8/2016 | Kuo ............... H01L 23/49816 |
| 9,583,687 B2 | 2/2017 | Hwang |
| 2001/0013423 A1 | 8/2001 | Dalal et al. |
| 2001/0038147 A1 | 11/2001 | Higashi et al. |
| 2002/0033412 A1 | 3/2002 | Tung |
| 2002/0084528 A1 | 7/2002 | Kim et al. |
| 2002/0100974 A1 | 8/2002 | Uchiyama |
| 2002/0106832 A1 | 8/2002 | Hotchkiss et al. |
| 2002/0197811 A1 | 12/2002 | Sato |
| 2003/0049886 A1 | 3/2003 | Salmon |
| 2003/0092219 A1 | 5/2003 | Ohuchi et al. |
| 2003/0094963 A1 | 5/2003 | Fang |
| 2003/0166331 A1 | 9/2003 | Tong et al. |
| 2003/0216025 A1 | 11/2003 | Lu et al. |
| 2003/0218250 A1 | 11/2003 | Kung et al. |
| 2003/0233133 A1 | 12/2003 | Greenberg et al. |
| 2004/0004284 A1 | 1/2004 | Lee et al. |
| 2004/0007779 A1 | 1/2004 | Arbuthnot et al. |
| 2004/0140538 A1 | 7/2004 | Harvey |
| 2004/0159944 A1 | 8/2004 | Datta et al. |
| 2004/0166661 A1 | 8/2004 | Lei |
| 2004/0212098 A1 | 10/2004 | Pendse |
| 2004/0251546 A1 | 12/2004 | Lee et al. |
| 2005/0017376 A1 | 1/2005 | Tsai |
| 2005/0062153 A1 | 3/2005 | Saito et al. |
| 2005/0158900 A1 | 7/2005 | Lee |
| 2005/0212114 A1 | 9/2005 | Kawano et al. |
| 2005/0224991 A1 | 10/2005 | Yeo |
| 2005/0253264 A1 | 11/2005 | Aiba et al. |
| 2005/0277283 A1 | 12/2005 | Lin et al. |
| 2006/0012024 A1 | 1/2006 | Lin et al. |
| 2006/0017160 A1 | 1/2006 | Huang |
| 2006/0038303 A1 | 2/2006 | Sterrett et al. |
| 2006/0051954 A1 | 3/2006 | Lin et al. |
| 2006/0055032 A1 | 3/2006 | Chang et al. |
| 2006/0076677 A1 | 4/2006 | Daubenspeck et al. |
| 2006/0209245 A1 | 9/2006 | Mun et al. |
| 2006/0223313 A1 | 10/2006 | Yoon et al. |
| 2006/0279881 A1 | 12/2006 | Sato |
| 2006/0292824 A1 | 12/2006 | Beyne et al. |
| 2007/0001280 A1 | 1/2007 | Hua |
| 2007/0012337 A1 | 1/2007 | Hillman et al. |
| 2007/0018294 A1 | 1/2007 | Sutardja |
| 2007/0020906 A1 | 1/2007 | Chiu et al. |
| 2007/0023483 A1 | 2/2007 | Yoneyama et al. |
| 2007/0045840 A1 | 3/2007 | Varnau |
| 2007/0057022 A1 | 3/2007 | Mogami et al. |
| 2007/0114663 A1 | 5/2007 | Brown et al. |
| 2007/0200234 A1 | 8/2007 | Gerber et al. |
| 2008/0003402 A1 | 1/2008 | Haba et al. |
| 2008/0003715 A1 | 1/2008 | Lee |
| 2008/0023850 A1 | 1/2008 | Lu et al. |
| 2008/0087998 A1 | 4/2008 | Kamins |
| 2008/0128911 A1 | 6/2008 | Koyama |
| 2008/0150135 A1 | 6/2008 | Oyama et al. |
| 2008/0169544 A1 | 7/2008 | Tanaka et al. |
| 2008/0180376 A1 | 7/2008 | Kim et al. |
| 2008/0194095 A1 | 8/2008 | Daubenspeck et al. |
| 2008/0217047 A1 | 9/2008 | Hu |
| 2008/0218061 A1 | 9/2008 | Chao et al. |
| 2008/0277785 A1 | 11/2008 | Hwan et al. |
| 2009/0025215 A1 | 1/2009 | Murakami et al. |
| 2009/0042144 A1 | 2/2009 | Kitada et al. |
| 2009/0045499 A1 | 2/2009 | Kim et al. |
| 2009/0075469 A1 | 3/2009 | Furman et al. |
| 2009/0087143 A1 | 4/2009 | Jeon |
| 2009/0091024 A1 | 4/2009 | Zeng et al. |
| 2009/0096092 A1 | 4/2009 | Patel |
| 2009/0108443 A1 | 4/2009 | Jiang |
| 2009/0146316 A1 | 6/2009 | Jadhav et al. |
| 2009/0149016 A1 | 6/2009 | Park et al. |
| 2009/0166861 A1 | 7/2009 | Lehr et al. |
| 2009/0174067 A1 | 7/2009 | Lin |
| 2009/0218702 A1 | 9/2009 | Beyne et al. |
| 2009/0233436 A1 | 9/2009 | Kim et al. |
| 2009/0250814 A1 | 10/2009 | Pendse et al. |
| 2010/0007019 A1 | 1/2010 | Pendse |
| 2010/0044860 A1 | 2/2010 | Haba et al. |
| 2010/0052473 A1 | 3/2010 | Kimura |
| 2010/0084763 A1 | 4/2010 | Yu |
| 2010/0141880 A1 | 6/2010 | Koito et al. |
| 2010/0193944 A1 | 8/2010 | Castro et al. |
| 2010/0200279 A1 | 8/2010 | Kariya et al. |
| 2010/0252926 A1 | 10/2010 | Kato et al. |
| 2010/0258950 A1 | 10/2010 | Li et al. |
| 2010/0270458 A1 | 10/2010 | Lake et al. |
| 2010/0276787 A1 | 11/2010 | Yu et al. |
| 2010/0314745 A1 | 12/2010 | Masumoto et al. |
| 2010/0327422 A1 | 12/2010 | Lee et al. |
| 2011/0001250 A1 | 1/2011 | Lin et al. |
| 2011/0024902 A1 | 2/2011 | Lin et al. |
| 2011/0038147 A1 | 2/2011 | Lin et al. |
| 2011/0074022 A1 | 3/2011 | Pendse |
| 2011/0084386 A1 | 4/2011 | Pendse |
| 2011/0101519 A1 | 5/2011 | Hsiao et al. |
| 2011/0101526 A1 | 5/2011 | Hsiao et al. |
| 2011/0169158 A1 | 7/2011 | Varanasi |
| 2011/0177686 A1 | 7/2011 | Zeng |
| 2011/0186986 A1 | 8/2011 | Chuang et al. |
| 2011/0193220 A1 | 8/2011 | Kuo et al. |
| 2011/0227219 A1 | 9/2011 | Alvarado et al. |
| 2011/0244675 A1 | 10/2011 | Huang et al. |
| 2011/0248399 A1 | 10/2011 | Pendse |
| 2011/0260317 A1 | 10/2011 | Lu et al. |
| 2011/0285011 A1 | 11/2011 | Hwang et al. |
| 2011/0285023 A1 | 11/2011 | Shen et al. |
| 2012/0007230 A1 | 1/2012 | Hwang et al. |
| 2012/0007231 A1 | 1/2012 | Chang |

(56) References Cited

U.S. PATENT DOCUMENTS

| | | |
|---|---|---|
| 2012/0012997 A1 | 1/2012 | Shen et al. |
| 2012/0025365 A1 | 2/2012 | Haba |
| 2012/0040524 A1 | 2/2012 | Kuo et al. |
| 2012/0049346 A1 | 3/2012 | Lin et al. |
| 2012/0091577 A1 | 4/2012 | Hwang et al. |
| 2012/0098120 A1 | 4/2012 | Yu et al. |
| 2012/0098124 A1 | 4/2012 | Wu et al. |
| 2012/0146168 A1 | 6/2012 | Hsieh et al. |
| 2012/0223428 A1 | 9/2012 | Pendse |
| 2012/0306080 A1 | 12/2012 | Yu et al. |
| 2013/0026622 A1 | 1/2013 | Chuang et al. |
| 2013/0026629 A1 | 1/2013 | Nakano |
| 2013/0087920 A1 | 4/2013 | Jeng et al. |
| 2013/0093079 A1 | 4/2013 | Tu et al. |
| 2013/0181340 A1 | 7/2013 | Uehling et al. |
| 2013/0252418 A1 | 9/2013 | Arvin et al. |
| 2013/0270699 A1 | 10/2013 | Kuo et al. |
| 2013/0277830 A1 | 10/2013 | Yu et al. |
| 2013/0288473 A1 | 10/2013 | Chuang et al. |
| 2013/0341785 A1 | 12/2013 | Fu et al. |
| 2014/0048929 A1 | 2/2014 | Cha et al. |
| 2014/0054764 A1 | 2/2014 | Lu et al. |
| 2014/0054769 A1 | 2/2014 | Yoshida et al. |
| 2014/0054770 A1 | 2/2014 | Yoshida et al. |
| 2014/0061897 A1 | 3/2014 | Lin et al. |
| 2014/0061924 A1 | 3/2014 | Chen et al. |
| 2014/0077358 A1 | 3/2014 | Chen et al. |
| 2014/0077359 A1 | 3/2014 | Tsai et al. |
| 2014/0077360 A1 | 3/2014 | Lin et al. |
| 2014/0077365 A1 | 3/2014 | Lin et al. |
| 2014/0117533 A1 | 5/2014 | Lei et al. |
| 2014/0264890 A1 | 9/2014 | Breuer et al. |
| 2014/0346669 A1 | 11/2014 | Wang |
| 2014/0353820 A1 | 12/2014 | Yu et al. |
| 2015/0091160 A1 | 4/2015 | Reber |
| 2015/0325542 A1 | 11/2015 | Lin et al. |
| 2016/0190090 A1 | 6/2016 | Yu |
| 2016/0254240 A1 | 9/2016 | Chen |
| 2016/0329293 A1 | 11/2016 | Cha et al. |

FOREIGN PATENT DOCUMENTS

| | | |
|---|---|---|
| CN | 102254871 A | 11/2011 |
| CN | 102386158 A | 3/2012 |
| CN | 102468197 A | 5/2012 |
| EP | 1387402 A2 | 2/2004 |
| KR | 1020110002816 A | 1/2011 |
| KR | 1020110128532 A | 11/2011 |
| TW | 200826265 A | 6/2008 |
| TW | 200915452 A | 4/2009 |
| TW | 201133662 A | 10/2011 |
| TW | 201143007 A | 12/2011 |
| WO | 2009140238 A3 | 11/2009 |

\* cited by examiner

CONICAL-SHAPED OR TIER-SHAPED PILLAR CONNECTIONS

This application is a continuation application of U.S. patent application Ser. No. 15/243,523, filed on Aug. 22, 2016, now U.S. Pat. No. 10,056,345, entitled "Conical-Shaped or Tier-Shaped Pillar Connections," which is a continuation application of U.S. Patent Application No. 13/449,078, filed on Apr. 17, 2012, now U.S. Pat. No. 9,425,136, entitled "Conical-Shaped or Tier-Shaped Pillar Connections," each application is incorporated herein in its entirety

BACKGROUND

Generally, semiconductor dies comprise active devices, metallization layers forming connections to the active devices, and I/O contacts to provide the metallization layers (and active devices) signals and power. The metallization layers generally comprise a series of dielectric layers and metal layers in order to provide all of the required connections between the active devices and the I/O contacts (and between individual active devices). These dielectric layers may be formed from low-k dielectric materials with dielectric constants (k value) between about 2.9 and 3.8, ultra low-k (ULK) dielectric materials, with k values less than about 2.5, or even extra low-k (ELK) dielectric materials with k values between about 2.5 and about 2.9, or some combination of low-k dielectric materials.

However, while these low-k, ULK, and ELK materials may be used to improve the electrical characteristics of the metallization layers and thereby increase the overall speed or efficiency of the semiconductor device, these materials may also exhibit structural deficiencies. For example, some of these materials may have greater trouble than other dielectric materials handling the stresses applied to them in the semiconductor device. As such, the low-k, ULK, and ELK materials tend to delaminate or crack when too much pressure is applied to the low-K, ELK, and ULK materials, thereby damaging or destroying the semiconductor device and reducing yields and increasing costs.

These delamination issues related to stress can be particularly troublesome when using packaging techniques such as surface-mount technology (SMT) and flip-chip packaging. As opposed to more conventional packaged integrated circuits (ICs) that have a structure basically interconnected by fine gold wire between metal pads on the die and electrodes spreading out of molded resin packages, these packaging techniques rely on bumps of solder to provide an electrical connection between contacts on the die and contacts on a substrate, such as a packaging substrate, a printed circuit board (PCB), another die/wafer, or the like. The different layers making up the interconnection typically have different coefficients of thermal expansion (CTEs). As a result, additional stress derived from this difference is exhibited on the joint area, which also may cause cracks to form and/or delamination.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION

The making and using of embodiments are discussed in detail below. It should be appreciated, however, that this disclosure provides many applicable inventive concepts that can be embodied in a wide variety of specific contexts. The specific embodiments discussed herein are merely illustrative of specific ways to make and use the embodiments, and do not limit the scope of the disclosure.

Embodiments described herein relate to the use of bumps or balls (collectively referred to herein as bumps) for use with interconnecting one substrate with another substrate, wherein each substrate may be an integrated circuit die, an interposer, packaging substrate, printed circuit board, organic substrate, ceramic substrate, high-density interconnect, and/or the like. As will be discussed below, embodiments are disclosed that utilize a pillar and/or a bump having a smaller tip section relative to a base section, such as a conical or tiered shape. It has been found that embodiments such as those discussed herein may reduce delamination issues as well as reducing bridging between adjacent connections, thereby increasing throughput and reliability. The intermediate stages of a method for forming a conical or tiered shape pillar and/or bump are disclosed herein. Embodiments such as these may be suitable for use in flip-chip configuration, three-dimensional (3D) IC or stacked die configurations, and/or the like. Throughout the various views and illustrative embodiments, like reference numbers are used to designate like elements.

Figure 1:
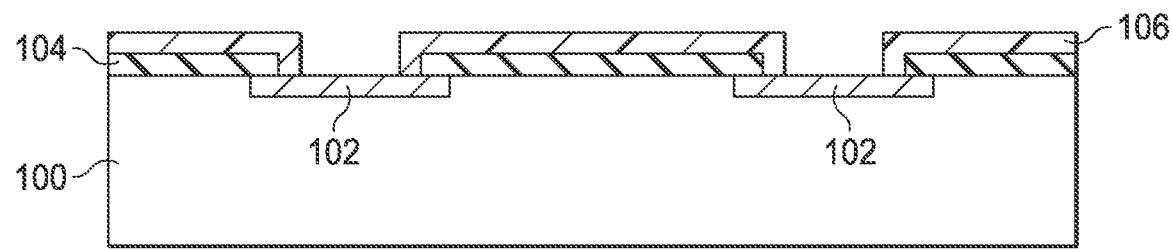
FIGS. 1-7 illustrate intermediate stages in forming a semiconductor device having a conical shaped pillar structure in accordance with an embodiment.

FIGS. 1-7 illustrate various intermediate stages of a method of forming a semiconductor device having a pillar and/or bump having a conical cross-sectional shape in accordance with an embodiment. Referring first to FIG. 1, a portion of a substrate 100 is shown in accordance with an embodiment. The substrate 100 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as multi-layered or gradient substrates may also be used. In another embodiment, the substrate 100 may comprise a substrate to which an integrated circuit die may be attached. For example, the substrate 100 may be an interposer, a packaging substrate, a high-density interconnect, a printed circuit board, another integrated circuit die, or the like.

It should be noted that in some embodiments, particularly in embodiments in which the substrate 100 is an integrated circuit die, the substrate 100 may include electrical circuitry (not shown). In an embodiment, the electrical circuitry includes electrical devices formed on the substrate 100 with one or more dielectric layers overlying the electrical devices. Metal layers may be formed between dielectric layers to route electrical signals between the electrical devices. Electrical devices may also be formed in one or more dielectric layers. In an embodiment, the substrate 100 includes one or more low-k and/or ELK dielectric layers.

For example, the electrical circuitry may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution circuitry, input/output circuitry, or the like. One of ordinary skill in the art will appreciate that the above examples are provided for illustrative purposes only to further explain applications of some illustrative embodiments and are not meant to limit the disclosure in any manner. Other circuitry may be used as appropriate for a given application.

Conductive traces 102 are provided in an upper surface of the substrate 100 to provide external electrical connections. It should be noted that the conductive traces 102 represent an electrical connection to electrical circuitry formed on the substrate 100, an electrical connection to a through-substrate via, a redistribution line, and/or the like. The conductive traces 102 may comprise a conductive material such as copper, although other conductive materials, such as tungsten, aluminum, copper alloy, or the like, may alternatively be used. The conductive traces 102 may be formed using a damascene or dual damascene process which may include a copper overfill into an opening followed by the removal of the excess copper through a process such as chemical mechanical polishing (CMP). However, any suitable material (such as, e.g., aluminum) and any suitable process (such as deposition and etching) may alternatively be used to form the conductive traces 102.

Embodiments such as those disclosed herein may be particularly beneficial in a system using bump-on-trace (BOT) technology. Generally, these techniques provide for a bump to be coupled directly to the conductive traces (such as conductive traces 852 of the second substrate 850 illustrated in FIG. 8). A solder resist may be used to protect other portions of the trace and/or other traces.

One or more passivation layers, such as passivation layer 104, are formed and patterned over the substrate 100 to provide an opening over the conductive traces 102 and to protect the underlying layers from various environmental contaminants. The passivation layer 104 may be formed of a dielectric material, such as PE-USG, PE-SiN, combinations thereof, and/or the like, by any suitable method, such as CVD, PVD, or the like. In an embodiment, the passivation layer 104 has a thickness of about 10,000 Å to about 15,000 Å. In an embodiment, the passivation layer 104 comprises a multi-layer structure of 750 Å of SiN, 6,500 Å of PE-USG, and 6,000 Å of PE-SiN.

A protective layer 106 formed and patterned over the passivation layer 104. The protective layer 106 may be, for example, a polyimide material formed by any suitable process, such as spin coating of a photo resister, or the like. In an embodiment, the protective layer 106 has a thickness between about 2.5 µm and about 10 µm.

One of ordinary skill in the art will appreciate that a single layer of conductive/bond pads and a passivation layer are shown for illustrative purposes only. As such, other embodiments may include any number of conductive layers and/or passivation layers. Furthermore, it should be appreciated that one or more of the conductive layers may act as a RDL to provide the desired pin or ball layout.

Any suitable process may be used to form the structures discussed above and will not be discussed in greater detail herein. As one of ordinary skill in the art will realize, the above description provides a general description of the features of the embodiment and that numerous other features may be present. For example, other circuitry, liners, barrier layers, under-bump metallization configurations, and the like, may be present. The above description is meant only to provide a context for embodiments discussed herein and is not meant to limit the disclosure or the scope of any claims to those specific embodiments.

Figure 2:
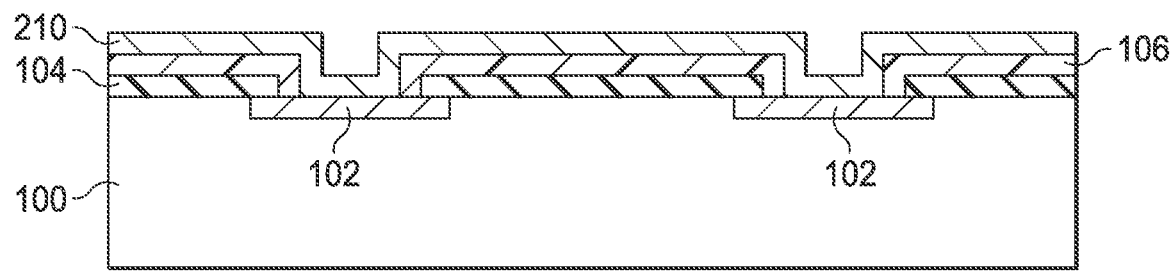

Referring now to FIG. 2, a conformal seed layer 210 is deposited over the surface of the protective layer 106 and the exposed portions of the conductive traces 102. The seed layer 210 is a thin layer of a conductive material that aids in the formation of a thicker layer during subsequent processing steps. In an embodiment, the seed layer 210 may be formed by depositing a thin conductive layer, such as a thin layer of Cu, Ti, Ta, TiN, TaN, or the like, using chemical vapor deposition (CVD) or plasma vapor deposition (PVD) techniques. For example, in an embodiment, the seed layer 210 is a composite layer including a layer of Ti deposited by a PVD process to a thickness of about 500 Å and a layer of Cu deposited by a PVD process to a thickness of about 3,000 Å. Other materials, processes, and thicknesses may be used.

The embodiment illustrated in FIG. 2 illustrates an intermediate step in forming a BOT configuration in which a pillar structure, e.g., including a seed layer (if any) and a pillar, is formed directly on the trace. In such an embodiment, an under-bump metallization (UBM) layer may be omitted. In other embodiments, however, additional layers and/or UBM structures may be utilized.

Figure 3:
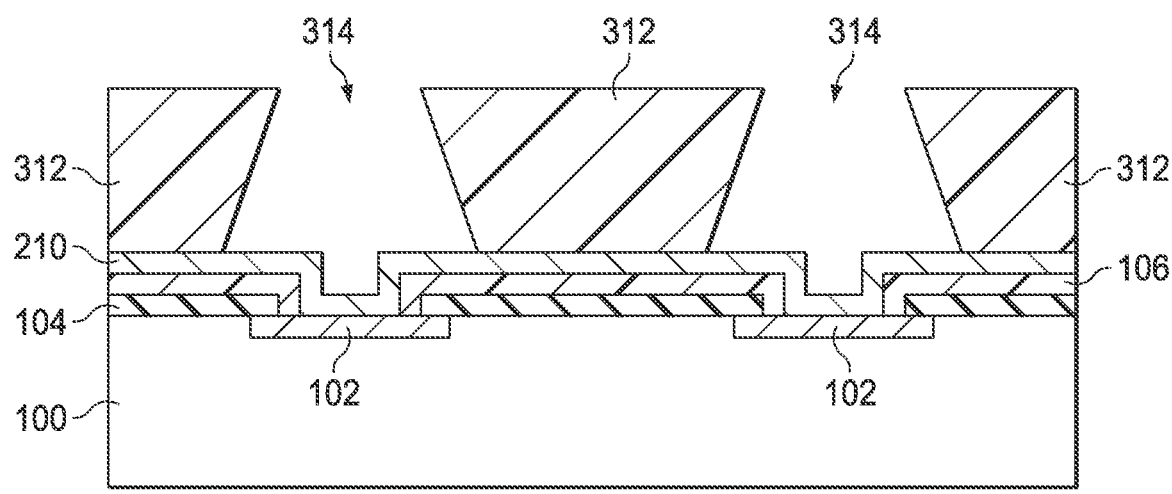

FIG. 3 illustrates a first patterned mask 312 formed over the seed layer 210 in accordance with an embodiment. The first patterned mask 312 will act as a mold for forming conductive pillars in subsequent processing steps. The first patterned mask 312 may be a patterned photoresist mask, hard mask, and/or the like. In an embodiment, a photoresist material is deposited and patterned to form openings 314.

It should be noted that the embodiment illustrated in FIG. 3 utilizes sloped sidewalls such that the openings 314 are wider along the bottom of the openings along the seed layer 210 than the top portion of the openings 314, thereby resulting in a conical shape. The tapered profile may be created by any suitable technique, such as the use of multiple photoresist layers with different patterning properties and one or more exposures, diffusion techniques, an image reversal process, multiple exposures using different masks, and/or the like.

Figure 4:
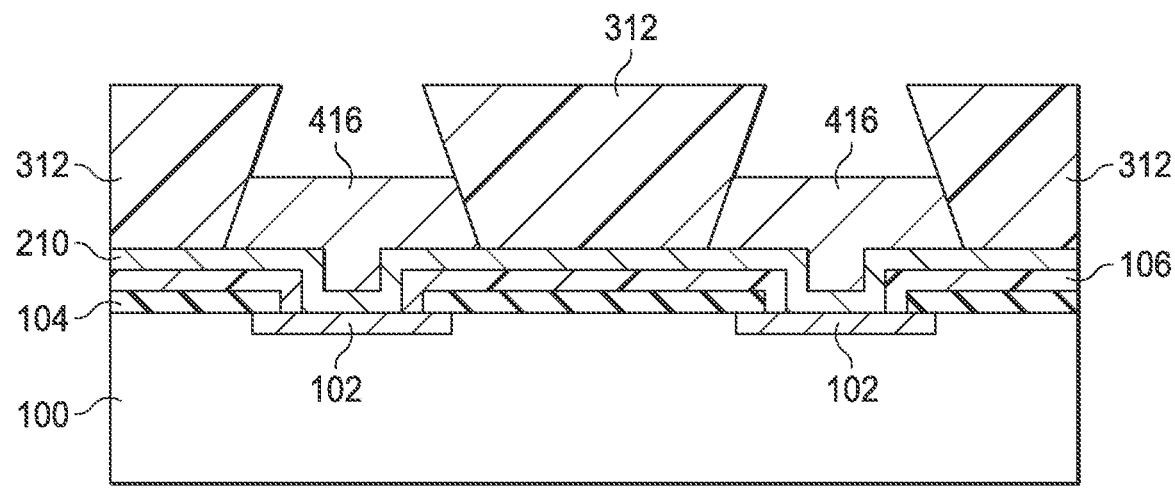

Thereafter, conductive pillar 416 is formed in the openings 314 (see FIG. 3) as illustrated in FIG. 4. The conductive pillar 416 comprises one or more conductive materials, such as copper, tungsten, other conductive metals, or the like, and may be formed, for example, by electroplating, electroless plating, or the like. In an embodiment, an electroplating process is used wherein the wafer is submerged or immersed in the electroplating solution. The wafer surface is electrically connected to the negative side of an external DC power supply such that the wafer functions as the cathode in the electroplating process. A solid conductive anode, such as a copper anode, is also immersed in the solution and is attached to the positive side of the power supply. The atoms from the anode are dissolved into the solution, from which the cathode, e.g., the wafer, acquires, thereby plating the exposed conductive areas of the wafer, e.g., exposed portions of the seed layer 210 within the openings 314.

Figure 5:
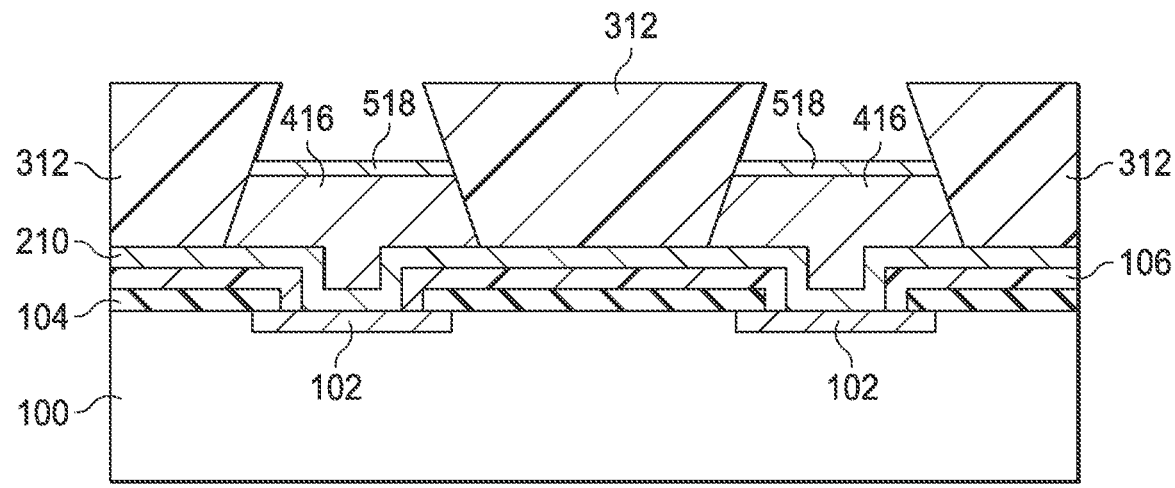

FIG. 5 illustrates formation of an optional conductive cap layer 518 formed over the conductive pillar 416. As described in greater detail below, solder material will be formed over the conductive pillar 416. During the soldering process, an inter-metallic compound (IMC) layer is naturally formed at the joint between the solder material and the underlying surface. It has been found that some materials may create a stronger, more durable IMC layer than others. As such, it may be desirable to form a cap layer, such as the conductive cap layer 518, to provide an IMC layer having more desirable characteristics. For example, in an embodiment in which the conductive pillar 416 is formed of copper, a conductive cap layer 518 formed of nickel may be desirable. Other materials, such as Pt, Au, Ag, combinations thereof, or the like, may also be used. The conductive cap layer 518 may be formed through any number of suitable techniques, including PVD, CVD, ECD, MBE, ALD, electroplating, and the like.

Figure 6:
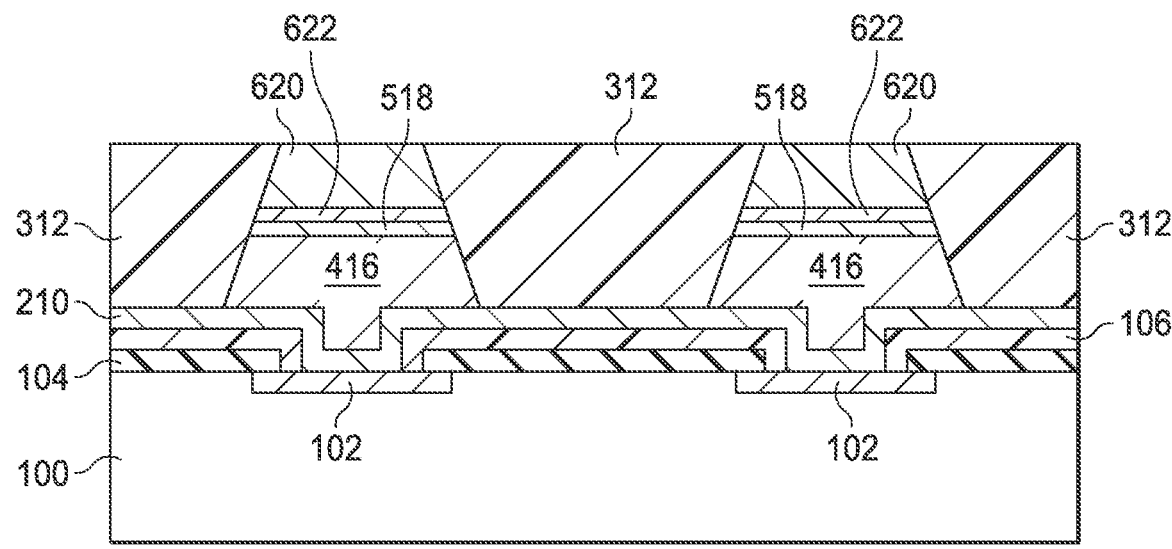

FIG. 6 illustrates formation of solder material 620 and an IMC layer 622. In an embodiment, the solder material 620 comprises SnPb, a high-Pb material, a Sn-based solder, a lead-free solder, a SnAg solder, a SnAgCu solder, or other suitable conductive material. FIG. 6 illustrates an embodiment in which the solder material 620 is formed while the first patterned mask 312 is present and exhibits a conical shape similar to the underlying conductive pillar 416. In other embodiments, the solder material 620 (or other suitable material) may be placed on the conductive pillars after removal of the first patterned mask 312.

Figure 7:
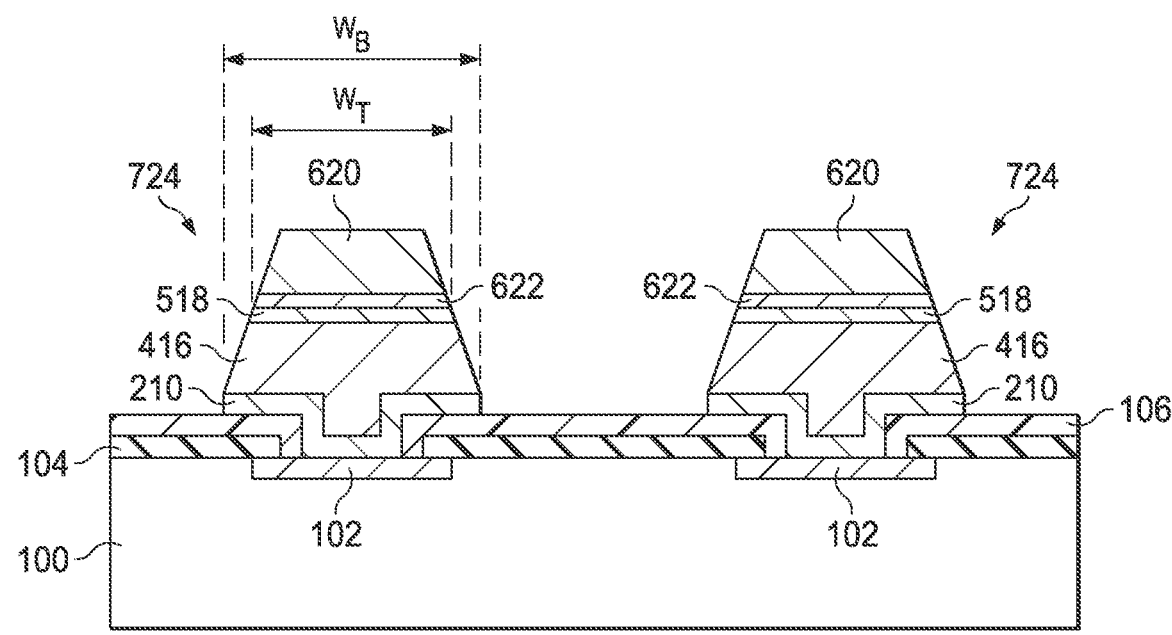

FIG. 7 illustrates the removal of the first patterned mask 312 (see FIG. 3) in accordance with an embodiment. In an embodiment in which the first patterned mask 312 is a photoresist mask, a plasma ashing or wet strip process may be used to remove the first patterned mask 312. The exposed portions of the seed layer 210 may be removed by, for example, a wet etching process. Optionally, a wet dip in a sulfuric acid ($H_2SO_4$) solution may be used to clean the wafer and remove remaining photoresist material. A reflow process may be performed, which may cause the solder material 620 to have a rounded shape.

The conductive pillar 416 and, optionally, the conductive cap layer 518 form a conductive bump 724 having a conical shape such that sidewalls of the conductive bump 724 are tapered. In this situation, a width of the base portion $W_B$ is greater than a width of the tip portion $W_T$. The relatively wide base dimension may reduce current density and the narrower top portion may reduce the probability of misalignment when coupling the first substrate 100 to another substrate.

A ratio of the width of the tip portion $W_T$ to the width of the base portion $W_B$ may be adjusted for a particular purpose or application. For example, in an embodiment, the ratio of $W_T$ to $W_B$ may be from about 0.5 to about 0.99. In another embodiment, the ratio of $W_T$ to $W_B$ may be from about 0.6 to about 0.98. In another embodiment, the ratio of $W_T$ to $W_B$ may be from about 0.7 to about 0.93. In another embodiment, the ratio of WT to WB may be from about 0.75 to about 0.92. In another embodiment, the ratio of WT to WB may be from about 0.75 to about 0.97.

Figure 8A:
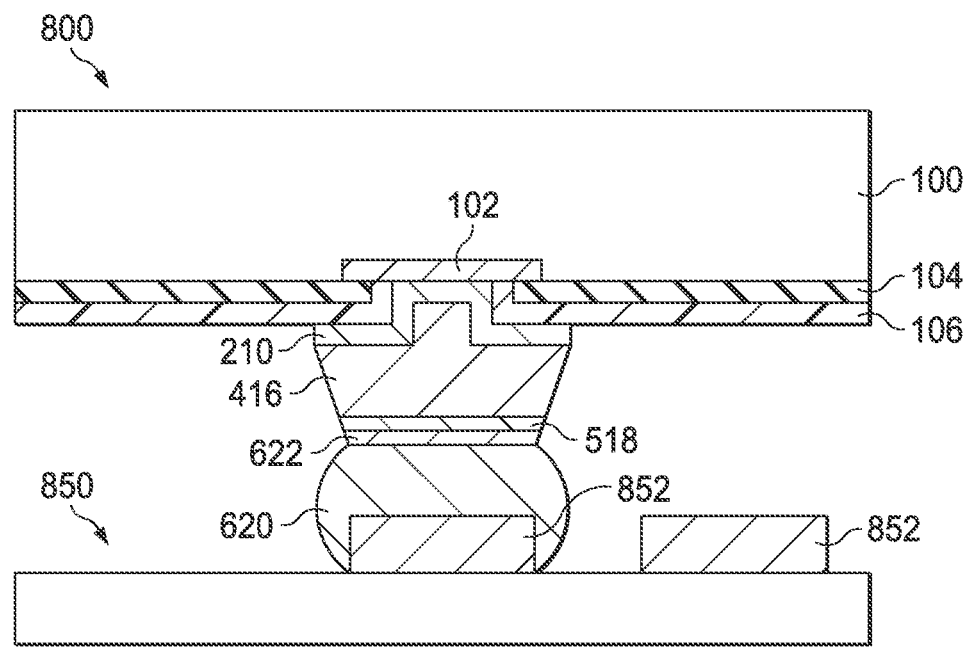
FIGS. 8A and 8B illustrate a first substrate connected to a second substrate using a conical shaped pillar in accordance with an embodiment.
Figure 8B:
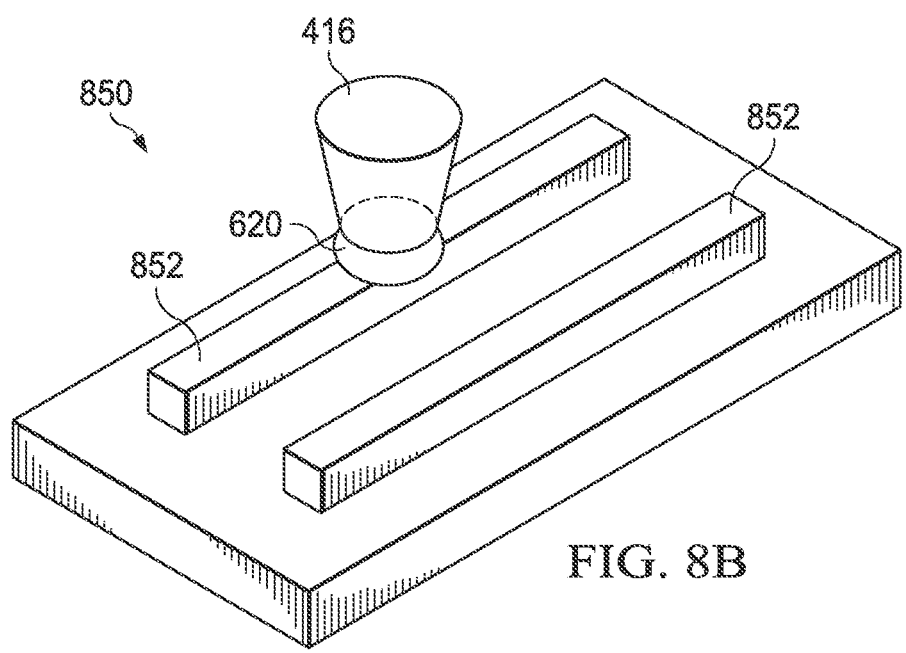

FIGS. 8A and 8B illustrate joining two substrates in accordance with an embodiment, wherein FIG. 8A is a side view and FIG. 8B is a perspective view. The first substrate 800, represents a substrate such as the substrate 100 discussed above with reference to FIGS. 1-7, wherein like reference numerals refer to like elements. The second substrate 850 represents a substrate to be attached to the first substrate 800 and may be an organic substrate, a PCB, a ceramic substrate, integrated circuit die, an interposer, a packaging substrate, a high-density interconnect, or the like.

The second substrate 850 includes conductive traces 852 formed thereon. The conductive traces may be formed of any suitable conductive material, such as copper, tungsten, aluminum, silver, combinations thereof, or the like. It should be noted that the conductive traces 852 may be a portion of redistribution layer. As illustrated in FIGS. 8A and 8B, the solder material 620 of the first substrate 100 is brought into contact with the conductive trace 852 and a reflow process is performed. Due to the conical shape of the pillar 416 and/or solder material 620, the solder material may be brought into direct contact with the raised conductive traces 852 while reducing the risk of bridging between adjacent ones of the conductive traces 852.

Figure 9:
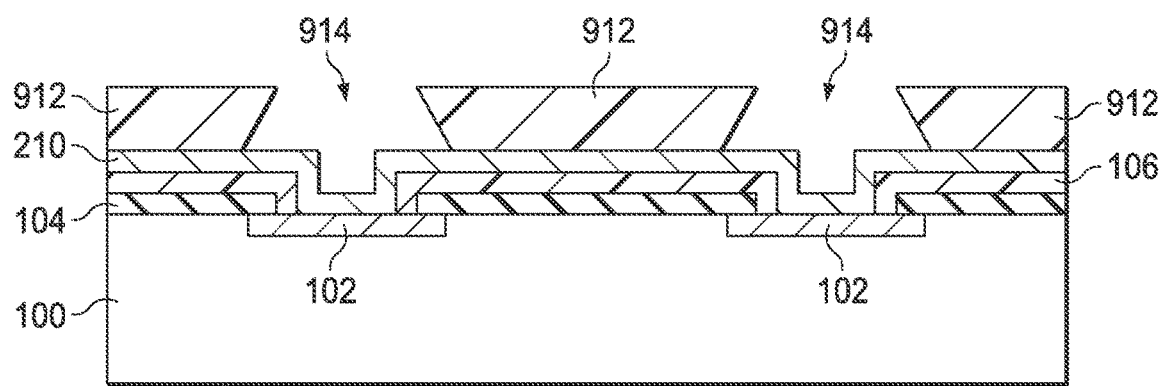
FIGS. 9-12 illustrate intermediate stages in forming a semiconductor device having a tiered pillar structure in accordance with an embodiment.

FIGS. 9-12 illustrate another embodiment in which a tiered pillar is utilized. FIGS. 9-12 illustrate another embodiment in which a multi-tiered pillar structure is formed, rather than a single-tiered pillar structure illustrated in FIGS. 8A and 8B. The multi-tiered pillar structure of FIGS. 9-12 may be connected to the second substrate (see FIGS. 8A and 8B) by replacing the single-tiered pillar structure of FIGS. 8A and 8B. Referring first to FIG. 9, there is shown a structure similar to that discussed above with reference to FIG. 3, wherein like reference numerals refer to like elements, except that the first patterned mask 312 is replaced with a first tier patterned mask 912 that is formed and patterned to form a first tier of a pillar structure in openings 914 as explained in greater detail below.

Figure 10:
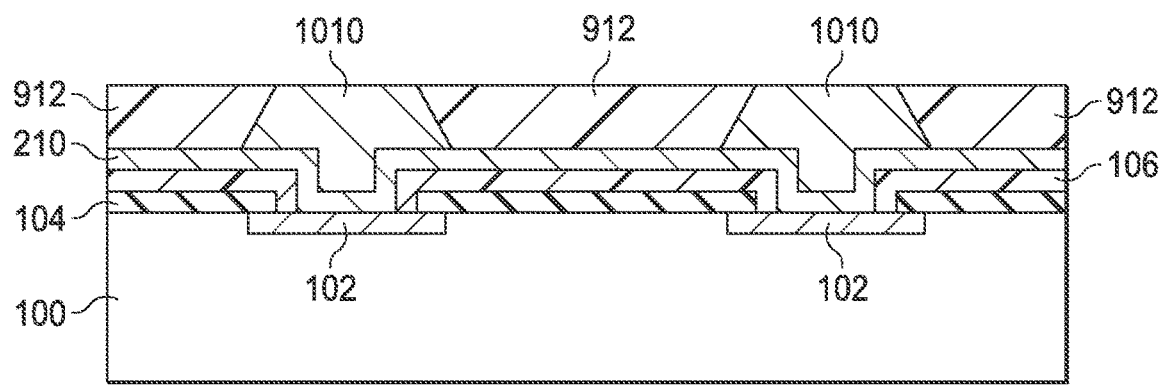

Referring now to FIG. 10, there is shown a first tier pillar structure 1010 formed in the openings 914. In this embodiment, the first tier pillar structure 1010 is formed to an upper surface of the first tier patterned mask 912. The first tier patterned mask 912 and the first tier pillar structure 1010 of FIG. 10 may be formed in a similar manner using similar processes and similar materials as those used to form the first patterned mask 312 and the conductive pillar 416 of FIG. 3. A planarization process, such as a CMP process may be used to remove excess material.

Figure 11:
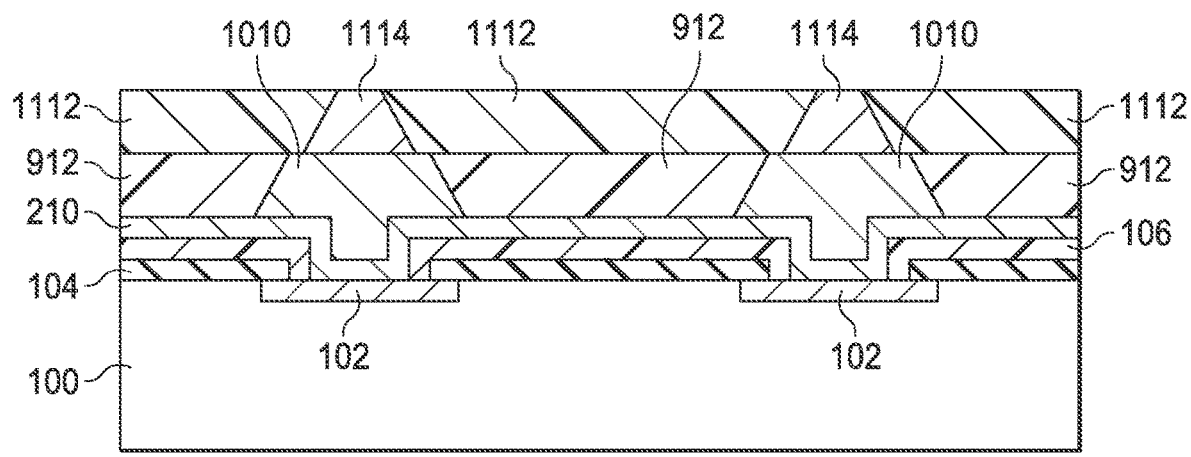

FIG. 11 illustrates a second tier patterned mask 1112 formed over the first tier patterned mask 912. The second tier patterned mask 1112 may be formed in a similar manner using similar processes and similar materials as those used to form the first tier patterned mask 912. FIG. 11 further illustrates a second tier pillar structure 1114 formed overlying the first tier pillar structure 1010.

It should be noted, however, that two tiers are illustrated in this embodiment for illustrative purposes only and that other embodiments may utilize more tiers. After forming the uppermost tier pillar structure, such as the second tier pillar structure 1114, the first tier patterned mask 912 and the second tier patterned mask 1112 may be removed, thereby resulting in the pillar structure as illustrated in FIG. 12.

Figure 12:
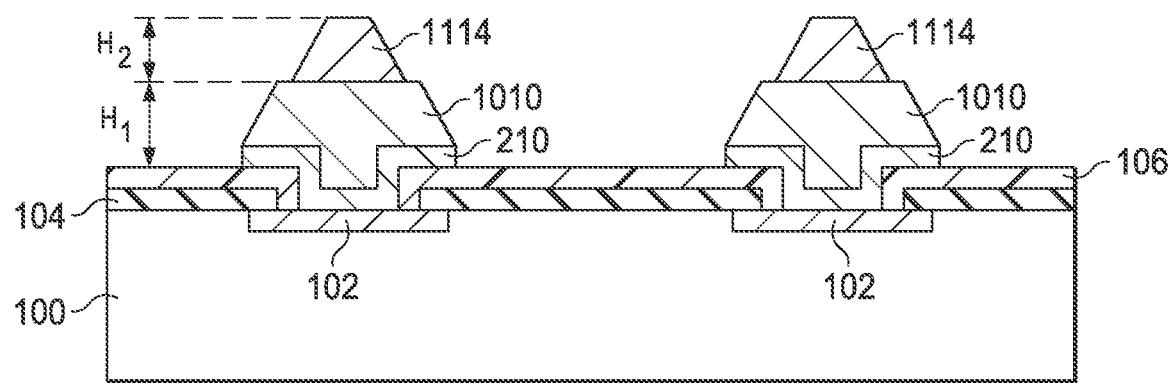

As illustrated in FIG. 12, the first tier pillar structure 1010 and the second tier pillar structure 1114 form a step pattern such that a lower level tier pillar structure (e.g., the first tier pillar structure 1010) has a larger width than an upper level tier pillar structure (e.g., the second tier pillar structure 1114). In an embodiment, the first tier pillar structure 1010 has a height $H_1$ of about 100,000 Å to about 600,000 Å, and the second tier pillar structure 1114 has a height $H_2$ of about 50,000 Å to about 600,000 Å.

Figure 13:
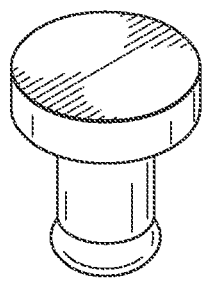
FIGS. 13-15 illustrate various shapes of tiered pillar structures in accordance with embodiments.

FIG. 12 illustrates an embodiment in which both tiers of the pillar structure exhibit tapered edges of a portion of a generally conical shape. Other embodiments may utilize one or more cylindrical sections rather than conical-shaped sections. For example, FIG. 13 illustrates an example embodiment in which the lower tier and the upper tier exhibit a cylindrical shape. The embodiment illustrated in FIG. 13 may be formed using similar materials and processes as those discussed above, except that the photoresist mask is exposed and developed such that vertical sidewalls are obtained rather than the tapered sidewalls.

Figure 14:
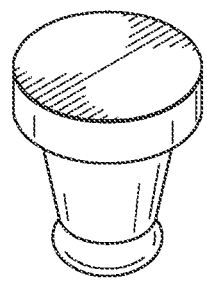
Figure 15:
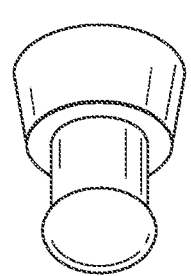
Figure 16A:
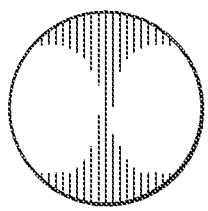
FIGS. 16A-16E illustrate various shapes in a plan view of pillar structures in accordance with various embodiments.
Figure 16B:
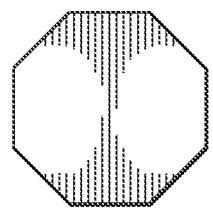
Figure 16C:
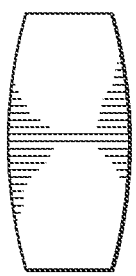
Figure 16D:
Figure 16E:
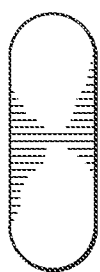

In yet other embodiments, a combination of cylindrical shaped tiers and conical shaped tiers may be used. For example, FIG. 14 illustrates an embodiment in which the lower tier exhibits a cylindrical shape and the upper tier exhibits a conical shape. Another embodiment may utilize a lower tier having a conical shape and an upper tier having a cylindrical shape as illustrated in FIG. 15.

As discussed above, embodiments may utilize various shapes in a plan view, such as those illustrated in FIGS. 16A-16E. These embodiments include elongated shapes, such as those illustrated in FIGS. 16C-16E. Each of these shapes may be used in embodiments having a continuous shape (e.g., FIGS. 1-7) or tiered shape (e.g., FIGS. 8-14).

Embodiments using an oblong or irregular shape may exhibit similar ratios as those discussed above along the other axis, e.g., the major and minor axis.

In accordance with an embodiment, a device comprising a first substrate and a second substrate is provided. The first substrate includes a conductive trace formed thereon with a conductive pillar formed directly on the conductive trace. The conductive trace exhibits a planar upper surface and at least a portion of the conductive pillar has a conical shape. The second substrate includes conductive traces formed thereon, such that an upper surface of the conductive traces is raised above an upper surface of the second substrate. The conductive pillar of the first substrate is coupled to the conductive traces on the second substrate.

In accordance with another embodiment, a device is provided. A substrate having a conductive trace formed thereon is provided. A conductive pillar is coupled to the conductive trace, wherein the conductive pillar has a plurality of tiers such that an upper tier has a smaller area in a plan view than a lower tier.

In accordance with yet another embodiment, another device is provided. A substrate having a conductive trace formed thereon is provided such that at least a portion of the conductive trace is exposed. A conductive pillar is positioned over the conductive trace, wherein the conductive pillar has one or more tiers, at least one of the one or more tiers having an elongated shape.

In accordance with yet another embodiment, a method is provided. The method includes forming a first mask, the first mask having a first opening over a conductive trace on a first substrate, forming a first tier in the first opening, forming a second mask over the first mask, the second mask having a second opening over the first tier, and forming a second tier in the second opening. The method further includes removing the first mask and the second mask, each of the first tier and the second tier having a conical shape and a surface of an overlying tier has a smaller area in a plan view than an adjacent surface of a lower tier.

In accordance with yet another embodiment, a method is provided. The method includes forming a plurality of tiers, the plurality of tiers forming the connector. Forming each tier of the plurality of tiers includes forming a mask and forming a tier in the mask. The method further includes removing each mask.

In accordance with yet another embodiment, a method is provided. The method includes forming a first mask, the first mask having a first opening over a conductive trace on a first substrate, forming a first tier in the first opening, and forming a second tier in the first opening, the first tier being interposed between the second tier and the conductive trace, wherein the first tier and the second tier are formed of different materials. The method further includes removing the first mask.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A device comprising:
    a first substrate;
    a conductive pillar structure on the first substrate, the conductive pillar structure comprising a conductive pillar, the conductive pillar having a first tier and a second tier, the first tier being interposed between the second tier and the first substrate, the first tier having a first surface and a second surface opposite the first surface, the first surface being interposed between the second surface and the first substrate, the second tier having a third surface and a fourth surface opposite the third surface, the third surface contacting the second surface, wherein an exposed portion of the second surface is free of the third surface;
    a second substrate;
    a conductive trace on a first surface of the second substrate, an outer surface of the conductive trace being non-planar with the first surface of the second substrate, wherein the conductive trace of the second substrate is elongated in a direction of elongation along the first surface of the second substrate; and
    a bump-on-trace bonding the conductive pillar structure on the first substrate to the conductive trace on the second substrate, wherein at least the conductive trace extends beyond the bump-on-trace on opposing sides of the bump-on-trace in the direction of elongation, the bump-on-trace being a different material than the conductive pillar, the bump-on-trace not extending along sidewalls of the conductive pillar.

2. The device of claim 1, wherein the first tier has tapered sidewalls.

3. The device of claim 2, wherein the second tier has tapered sidewalls.

4. The device of claim 1, wherein the second tier has tapered sidewalls.

5. The device of claim 1, wherein a thickness of the first tier is greater than a thickness of the second tier.

6. The device of claim 1, wherein the exposed portion surrounds the second tier in a plan view.

7. The device of claim 1, wherein the first tier or the second tier has a cylindrical shape.

8. A device comprising:
    a first substrate having a conductive trace formed thereon;

a conductive pillar structure coupled to the conductive trace, the conductive pillar structure comprising a conductive layer and a conductive pillar over the conductive layer, the conductive layer comprises a different material than the conductive pillar, sidewalls of the conductive layer not extending beyond sidewalls of the conductive pillar in a plan view, the conductive pillar having a first tier and a second tier, wherein a first surface of the first tier physically contacts a second surface of the second tier, wherein the first tier and the second tier has a conical shape, wherein a surface area of the first surface of the first tier is greater than a surface area of the second surface of the second tier;

a second substrate having a raised trace formed thereon, wherein the raised trace of the second substrate is elongated in a direction of elongation along a major surface of the second substrate; and a bump electrically connecting the conductive pillar on the first substrate to the raised trace on the second substrate, the bump not extending along sidewalls of the conductive pillar, wherein the raised trace extends beyond the bump on both sides of the bump in the direction of elongation.

9. The device of claim 8, wherein the conductive layer is a composite layer.

10. The device of claim 9, wherein the composite layer comprises a sub-layer of Ti and a sub-layer of Cu over the sub-layer of Ti.

11. The device of claim 8, wherein the first tier has a height of 100,000 Å to 600,000 Å.

12. The device of claim 8, wherein the second tier has a height of 50,000 Å to 600,000 Å.

13. The device of claim 8, further comprising an insulating layer over the conductive trace, wherein the conductive pillar extends closer to the conductive trace than an uppermost surface of the insulating layer.

14. The device of claim 13, wherein the insulating layer is interposed between the conductive pillar and the conductive trace.

15. The device of claim 8, wherein a height of a first tier is greater than a height of the second tier.

16. The device of claim 8, wherein the conductive pillar has an elongated shape.

17. A device comprising:

a first substrate;

a conductive trace on the first substrate, wherein at least a portion of the conductive trace being is exposed; and a conductive pillar formed over the conductive trace, the conductive pillar having a first tier and a second tier, the first tier or the second tier having an elongated shape, a cap layer on the second tier such that the second tier is interposed between the cap layer and the first tier, wherein a smallest width of the first tier is greater than a largest width of the second tier;

a second substrate having a raised trace thereon, wherein the raised trace of the second substrate is elongated in a direction of elongation along a major surface of the second substrate, wherein the raised trace has first opposing sidewalls and second opposing sidewalls different than the first opposing sidewalls, the first opposing sidewalls and the second opposing sidewalls extending away from the second substrate; and a bump on the cap layer electrically connecting the conductive pillar on the first substrate to the raised trace on the second substrate, wherein the bump extends along the first opposing sidewalls of the raised trace, wherein the second opposing sidewalls of the raised trace intersecting intersect the direction of elongation and being are free of the bump.

18. The device of claim 17, wherein the conductive pillar comprises a conductive seed layer, wherein a width of the conductive seed layer is no greater than a width of the conductive pillar closest to the first substrate.

19. The device of claim 17, wherein a slope of a sidewall of the first tier is different than a slope of a sidewall of the second tier.

20. The device of claim 17, wherein a ratio of a width of the conductive pillar furthest from the first substrate to a width of the conductive pillar closest to the first substrate is between about 0.75 and 0.92.

* * * * *